(12) United States Patent
Yoshimoto et al.

(10) Patent No.: US 8,693,854 B2
(45) Date of Patent: Apr. 8, 2014

(54) VACUUM HEATING DEVICE AND VACUUM HEAT TREATMENT METHOD

(75) Inventors: Tsuyoshi Yoshimoto, Chigasaki (JP);
Katsumi Yamane, Chigasaki (JP);
Tetsuhiro Ohno, Chigasaki (JP);
Takahiro Mizoguchi, Chigasaki (JP)

(73) Assignee: Ulvac, Inc., Chigasaki-Shi (JP)

( * ) Notice: Subject to any disclaimer, the term of this patent is extended or adjusted under 35 U.S.C. 154(b) by 186 days.

(21) Appl. No.: 13/218,766

(22) Filed: Aug. 26, 2011

(65) Prior Publication Data

US 2012/0045190 A1 Feb. 23, 2012

Related U.S. Application Data

(63) Continuation of application No. PCT/JP2010/053042, filed on Feb. 26, 2010.

(30) Foreign Application Priority Data

Feb. 27, 2009 (JP) .................................. 2009-46314

(51) Int. Cl.
*H05B 37/00* (2006.01)
(52) U.S. Cl.
USPC ........... 392/411; 219/494; 219/483; 219/484; 219/485; 315/49; 315/64; 315/68; 315/69
(58) Field of Classification Search
USPC ........... 219/494, 483–486, 503, 508; 307/17, 307/39–42; 363/125, 127; 315/49, 64, 68, 315/69, 70, 266, 278, 317, 362; 392/411
See application file for complete search history.

(56) References Cited

U.S. PATENT DOCUMENTS

| | | | | |
|---|---|---|---|---|
| 3,636,554 A | * | 1/1972 | Farneth | 341/116 |
| 4,695,771 A | * | 9/1987 | Hallay | 315/290 |
| 5,977,761 A | * | 11/1999 | Bilger et al. | 323/361 |
| 6,348,769 B1 | * | 2/2002 | Pinchuk et al. | 315/307 |
| 7,385,358 B2 | * | 6/2008 | Hsueh et al. | 315/254 |
| 2003/0029859 A1 | * | 2/2003 | Knoot et al. | 219/483 |

FOREIGN PATENT DOCUMENTS

| | | |
|---|---|---|
| JP | 64-86516 | 3/1989 |
| JP | 7-193019 | 7/1995 |
| JP | 10-294285 | 11/1998 |
| JP | 2002-190452 A1 | 7/2002 |
| JP | 2004-241745 A1 | 8/2004 |
| JP | 2008-53035 A1 | 3/2008 |
| JP | 2009-4410 A1 | 1/2009 |

OTHER PUBLICATIONS

International Search Report for International Application No. PCT/JP2010/053042 dated Apr. 22, 2010.

* cited by examiner

*Primary Examiner* — Dana Ross
*Assistant Examiner* — James Sims, III
(74) *Attorney, Agent, or Firm* — Kratz, Quintos & Hanson, LLP

(57) ABSTRACT

A uniform voltage is applied to loads even to other than a multiple of three loads made of heating lamps connected in parallel to each other, without causing any burden on a primary side. The number of loads is divided into a multiple of three and a multiple of two. A three-phase AC voltage is applied to three primary windings, which are connected as a Y-connection or a Δ-connection. Secondary windings, which are each magnetically coupled to a primary winding of a plurality of three-phase transformers and have the same number of turns, are connected with the multiple of three loads.

10 Claims, 8 Drawing Sheets

VACUUM HEATING DEVICE AND VACUUM HEAT TREATMENT METHOD

This application is a continuation of International Application No. PCT/JP2010/053042, filed on Feb. 26, 2010, which claims priority to Japan Patent Application No. 2009-046314, filed on Feb. 27, 2009. The contents of the prior applications are herein incorporated by reference in their entireties.

BACKGROUND

The present invention generally relates to a vacuum heat treatment method (such as, sputtering, vapor deposition, or etching) for processing an object to be processed in a vacuum ambience while heating the object to be processed, and in particular, to a technique for heating an object to be processed with a heating lamp.

Objects to be processed (such as, semiconductor wafers or liquid-crystal glass substrates) have been processed by sputtering or vapor deposition so as to form thin films thereon or to pattern thin films on the object to be processed by etching or the like.

When such a processing is performed, the objects to be processed are heated for vacuum heat treatment, and employed as heating devices are resistive heaters that generate heat when energized or alternatively heating lamps that allow object to be processed which is located apart from the heating lamps.

The heating lamp, which heats an object to be processed mostly by radiation in a vacuum of a low thermal conductivity, so that the heating lamp requires a high electric current and is thus supplied with low-voltage power converted from a high-voltage three-phase AC power source. In a vacuum chamber, the reduced low voltage may advantageously provide a reduced potential difference between a voltage applied portion and the grounded chamber wall of the vacuum chamber, thereby causing no discharge in the presence of a potential difference of 100 V or less.

The heating lamp, a given number of which are included in one load, is supplied with power from one secondary winding of a three-phase transformer. Because the three-phase AC power source has three secondary windings, it may lead to a three-phase transformer having an unloaded secondary winding when the number of loads is other than a multiple of three. This may cause the three-phase AC power source to supply an unbalanced current from each phase and to be degraded in service efficiency, thereby requiring a large-capacity three-phase transformer.

See, [Patent Document 1] Japanese Patent Application Laid-Open No. Hei 10-294285, and [Patent Document 2] Japanese Patent Application Laid-Open No. 2002-190452.

SUMMARY OF THE INVENTION

The present invention is created to overcome the drawbacks of the aforementioned conventional technique. It is therefore an object of the invention to provide a vacuum heating device which reduces burden on the primary side even when the number of loads is not a multiple of three.

A three-phase transformer includes three transformers, each having a primary winding and a secondary winding that are magnetically coupled to each other.

Reference numeral 21 of FIG. 8(a) or reference numeral 22 of FIG. 8(b) shows a three-phase transformer with Δ-connection or Y-connection primary windings 51 to 53 of three single-phase transformers 55 to 57, respectively.

The primary windings 51 to 53 of the three-phase transformer 21 or 22 are magnetically coupled with secondary windings 61 to 63, respectively.

The present invention employs a plurality of three-phase transformers 21 shown in FIG. 8(a) or a plurality of three-phase transformers 22 shown in FIG. 8(b). The Δ-connection or Y-connection primary windings 51 to 53 of the three-phase transformer 21 or 22 are supplied with AC voltages from the R phase, S phase, and T phase of a three-phase AC power source 50, respectively. Here, the AC voltages are the same in magnitude but different in phase by 120°.

When either one of the three-phase transformer 21 having a Δ-connection and the three-phase transformer 22 having a Y-connection, is used, the numbers of turns of the primary windings 51 to 53 of the three-phase transformer 21 or 22 are equal to each other, and the secondary windings 61 to 63 of the three-phase transformer 21 or 22 are also equal to each other in the number of turns.

Each of the primary windings 51 to 53 and each of the secondary windings 61 to 63 have the same coupling coefficient. Therefore, when each of loads 65 having the same magnitude is connected to each of the secondary windings 61 to 63 of the single three-phase transformer 21 or 22, balanced currents having the same value flow through the three primary windings 51 to 53 of the three-phase transformer 21 or 22.

Next, a description will be made to the Scott transformer, which is employed in the present invention.

Reference numeral 23 of FIG. 9 denotes the Scott transformer having an M-seat transformer (Main Transformer) 58 and a T-seat transformer (Teaser Transformer) 59.

The M-seat transformer 58 includes an M-seat primary winding 71 and a secondary winding 81 magnetically coupled to the M-seat primary winding 71. The T-seat transformer 59 includes a T-seat primary winding 72 and a secondary winding 82 magnetically coupled to the T-seat primary winding 72.

The M-seat primary winding 71 has a midpoint 64 at which the number of turns of the M-seat primary winding 71 is halved and where a wiring is brought out. One end of the T-seat primary winding 72 is connected to the midpoint 64 by the wiring.

Both ends of the M-seat primary winding 71 are connected to any mutually different output terminals of the R phase, the S phase, and the T phase of the three-phase AC power source 50, and supplied with an AC voltage having the phase as output from the corresponding output terminal.

The other end of the T-seat primary winding 72 is connected to the output terminal having one of the R phase, the S phase, and the T phase of the three-phase AC power source 50, of which the M-seat primary winding 71 has not been connected. The other end of the T-seat primary winding 72 is supplied with an AC voltage having the phase as output from the corresponding output terminal.

As discussed above, the number of turns of the M-seat primary winding 71 between one end thereof and the midpoint 64 is half the number of turns of the M-seat primary winding 71 between both ends thereof. When the number of turns of the M-seat primary winding 71 is M, the number of turns of the M-seat primary winding 71 between either end thereof and the midpoint 64 is M/2.

In this configuration, with respect to the AC voltage between the both ends of the M-seat primary winding 71 in the M-seat transformer 58, the AC voltage appearing between the both ends of the T-seat primary winding 72 in the T-seat transformer 59 has a phase difference of 90° (or −90°). Furthermore, assuming the AC voltage between both ends of the M-seat primary winding 71 to be "V", the AC voltage appearing between both ends of the T-seat primary winding 72 has a magnitude expressed by V·(√3)/2 (=V×1.732 . . . /2).

The number of turns of the secondary winding 81 in the M-seat transformer 58 is equal to the number of turns of the secondary winding 82 in the T-seat transformer 59. In order to induce the same AC voltage "v" between the ends of both the secondary windings 81 and 82, the following two equations have to be satisfied;

$$M \cdot v = m \cdot V$$

$$T \cdot v = m \cdot V \cdot (\sqrt{3})/2$$

where "m" is the number of turns of the secondary winding 81 or 82, "M" is the number of turns of the M-seat primary winding 71, and "T" is the number of turns of the T-seat primary winding 72.

Solving these equations results in the number of turns T of the T-seat primary winding 72 to be:

$$T = ((\sqrt{3})/2) \cdot M.$$

When the magnitudes of the power used by the loads 65 connected to the secondary windings 81 and 82 are similar to each other, the Scott transformer 23 supplies equal currents from the R phase, the S phase, and the T phase and thus maintains good balance.

The secondary windings 61 to 63, 81, and 82 in the three-phase transformers 21 and 22 and the Scott transformer 23 are each provided with a center tap (midpoint) 28 at which the number of turns thereof is halved. The secondary windings 61 to 63, 81, and 82 are each connected in parallel with two modules 16 which constitute one load 65.

The R phase, S phase, and T phase of AC voltages supplied to the respective primary windings 51 to 53 induce a sine wave of AC voltages, which has a different phase from each other by 120° across the respective secondary windings 61 to 63, 81, and 82. The induced voltage is applied to the load 65 including two modules 16, thereby temperature of the heating lamps in the load 65 is raised and radiate heat waves.

The present invention is created based on the aforementioned findings. The present invention provides a vacuum heating device including a voltage converter in which a three-phase AC voltage supplied from a three-phase AC power source is input therein; and an AC voltage of which the three-phase AC voltage is converted in a magnitude that is output as a secondary voltage, a plurality of loads each provided with a predetermined number of heating lamps which can be energized in parallel. The secondary voltage is applied to the heating lamp and the heating lamp radiates heat waves; the voltage converter includes a three-phase transformer including three primary windings which connects in a Y-connection shape or a Δ-connection shape to which a three-phase AC voltage is applied; and three secondary windings magnetically coupled to the respective primary windings, one secondary winding supplying power to the one load, respectively. A Scott transformer includes an M-seat transformer and a T-seat transformer, both ends of an M-seat primary winding of the M-seat transformer being connected to any mutually different phases of the three-phase AC voltage, one end of a T-seat primary winding in the T-seat transformer being connected to a midpoint at which the number of turns of the M-seat primary winding is halved, and the other end of the T-seat primary winding being connected to a remaining one phase of the three-phase AC voltage. A number of turns of the secondary winding magnetically coupled to the M-seat primary winding is made the same number of turns of the secondary winding magnetically coupled to the T-seat primary winding, the T-seat primary winding having a number of turns equal to (√3)/2 times that of the M-seat primary winding. A plurality of the three-phase transformers and at least one the Scott transformers are used, and a multiple p of three and a multiple q of two, the total number of p and q of which is a number N of loads, are selected. The multiple p of three loads are supplied with power from the three-phase transformers, and the multiple q of two loads are supplied with power from the Scott transformers, thereby allowing the heating lamps to generate heat.

Furthermore, the present invention provides a vacuum heating device in which the number of the loads is other than a multiple of three loads.

Furthermore, the present invention provides a vacuum heating device in which the load has a first module having a plurality of the heating lamps connected in parallel and a second module having the same number of the heating lamps of the first module connected in parallel. The secondary windings of the three-phase transformer and the Scott transformer have a midpoint at which the number of turns thereof is halved, and the midpoint is connected to ground. The first module and the second module are connected with a bidirectional switch; and a series circuit of the first module and the bidirectional switch and a series circuit of the second module and the bidirectional switch are each connected between one and the other end of the secondary winding.

Furthermore, the present invention provides a vacuum heat treatment method for heating an object to be processed in a vacuum ambience by energizing a number of loads to generate heat. The load includes a predetermined number of heating lamps to be energized in parallel, the number of loads being other than a multiple of three loads. The method includes the steps of dividing the number of loads into a multiple of three and a multiple of two, applying a three-phase AC voltage to three primary windings of a three-phase transformer of which the primary winding are connected as Y-connection shape or Δ-connection shape, connecting a multiple of three loads to respective secondary windings which are each magnetically coupled to the primary windings of the plurality of three-phase transformers and the secondary windings have the same number of turns each other, applying AC voltages having different phases of the three-phase AC voltage to both ends of an M-seat primary winding of a Scott transformer, connecting one end of a T-seat primary winding having a number of turns equal to (√3)/2 times number of turns of the M-seat primary winding to a midpoint at which the number of turns of the M-seat primary winding is halved and applying an AC voltage of a remaining phase of the three-phase AC voltage to the other end of the T-seat primary winding, connecting a multiple of two loads to secondary windings having the same number of turns each other, the secondary windings being each magnetically coupled to the M-seat primary winding and the T-seat primary winding of at least one the Scott transformers, and energizing the heating lamps in the loads so as to generate heat.

Furthermore, the present invention provides a vacuum heat treatment method in which a change temperature is set, wherein the change temperature is higher than the room temperature and lower than a processing temperature to which a temperature of the object to be processed is raised, a temperature of the heating lamp being raised by a phase control when the temperature of the heating lamp is lower that the change temperature. The phase control is performed in a manner such that the secondary winding and the loads are conducted by the bidirectional switch for a period such that a voltage induced to the secondary winding passed its peak is reduced; and the voltage is interrupted when the induced voltage is at 0 V until the temperature of the heating lamp reaches the change temperature.

Furthermore, the present invention provides a vacuum heat treatment method including a further step of raising the temperature of the heating lamp by a cycle control when the heating lamp is at a higher temperature than the change temperature, and wherein the cycle control is performed in a manner such that a conduction period for making the bidirectional switch conducting and an interruption period for interrupting the bidirectional switch are combined, and each period is a 180°, which is a half wavelength from 0 V to 0 V of a voltage induced across the secondary winding.

Furthermore, the present invention provides a vacuum heat treatment method in which a ratio of the conduction period and the interruption period of the cycle control is controlled and the temperature of the heating lamp at a processing temperature is maintained higher than the change temperature.

Furthermore, the present invention provides a vacuum heat treatment method such that when the heating lamp stops being energized and the temperature of the heating lamp is lowered from the processing temperature, the cycle control is provided, temperature of the heating lamp is raised at a temperature where a minimum temperature higher than room temperature is reached.

In the heating lamp, the cycle control with the combination of a half wave which is conducted at an entire period of 180° and a half-wave which is interrupted at an entire period of 180° can be provided to control the amount of energization, so that the heating of an object to be processed to a predetermined processing temperature for vacuum heat treatment can be performed.

However, when the cycle control is performed for vacuum heat treatment in a vacuum chamber, which includes heating lamps at the room temperature in addition to a holder for holding an object to be processed, a large inrush current would flow through and cause damage to the controller or the heating power source.

In order to solve the above-discussed problem, the present invention provides a vacuum heat treatment method in which an object to be processed is carried into a vacuum chamber; a holder holds the object to be processed in the vacuum chamber; a controller controls and applies an AC voltage delivered by a heating power source to a heating lamp; and the heating lamp radiates heat waves to irradiate and heat the object to be processed and the holder arranged in vacuum ambience of the vacuum chamber, so that the vacuum processing of the object to be processed is performed. In such a method, the minimum temperature higher than room temperature, a processing temperature higher than the minimum temperature, and a change temperature between the minimum temperature and the processing temperature are preliminary set. A temperature of the object to be processed is measured by a sensor. When the temperature of the object to be processed is at room temperature, phase control which combines part of a half wavelength of conducting at a halfway point of 180° is used to control the radiation of heat waves from the heating lamp and temperature of the object to be processed is raised until the object to be processed reaches the change temperature. After the change temperature has been reached, a cycle control in which a half-wave which is conducted in the entire period of 180° and a half-wave which is interrupted in the entire period of 180° are combined is performed to control the radiation of heat waves from the heating lamp and thereby the temperature of the object to be processed is raised higher than the change temperature so as to reach the processing temperature for vacuum heat treatment.

Furthermore, the present invention can perform the aforementioned vacuum heat treatment as hereinafter described. When the sensor detects that the temperature of the object to be processed has been lowered to a temperature higher than the minimum temperature and lower than the minimum temperature, the cycle control is provided to control the radiation of heat waves from the heating lamp and thereby raising the temperature of the object to be processed.

Furthermore, any one of the aforementioned vacuum heat treatment methods can be performed hereinafter described. The sensor may be attached to the holder or the vacuum chamber to measure the temperature of the holder or the vacuum chamber and may employ the resulting temperature as the temperature of the object to be processed.

The combination of a three-phase transformer for supplying power to three loads and a Scott transformer for supplying power to one or two loads can eliminate any unloaded secondary winding so that an increase in the burden on the primary winding can be prevented.

Because the midpoint of the secondary winding is grounded, high voltage does not occur so that no discharge occurs in the vacuum chamber.

The combination of the phase control and the cycle control allows for the heating by the phase control when the heating lamp is at a low temperature and has a low resistance, and then moving on to the cycle control, causing no noise.

DETAILED DESCRIPTION OF THE INVENTION

Figure 1:
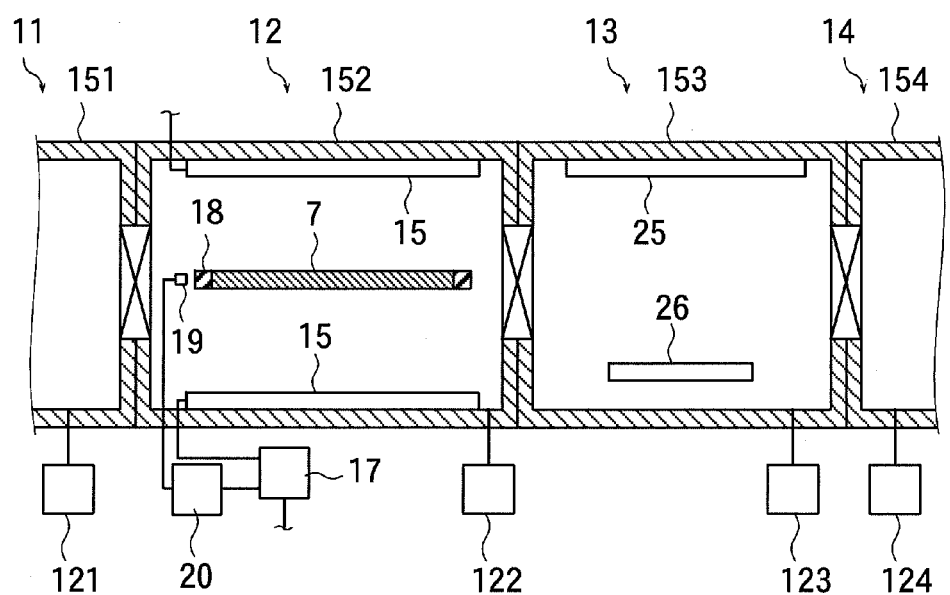
FIG. 1 is an explanatory view for illustrating a film forming apparatus to which the present invention is applied.

Reference numeral 1 of FIG. 1 generally shows a film forming apparatus, which has a carry-in unit 11, a heating unit 12, a processing unit 13, and a carry-out unit 14.

The units 11 to 14 have vacuum chambers 151 to 154, to which vacuum exhaust systems 121 to 124 are connected, respectively, so that each unit can be separately vacuum evacuated.

In the film forming apparatus 1, object to be processed (such as, semiconductor substrates or liquid crystal glass substrates or the like) is heated in a vacuum ambience in the vacuum chamber 152 of the heating unit 12, and then, a thin film is formed on the surface of the object to be processed in the vacuum chamber 153 of the processing unit 13.

Such a vacuum heat treatment method is hereinafter described. First, the vacuum chamber 152 of the heating unit 12 and the vacuum chamber 153 of the processing unit 13 are previously vacuum evacuated. Then, after an object to be processed is carried into the vacuum chamber 151 of the carry-in unit 11, the vacuum chamber 151 of the carry-in unit 11 is vacuum evacuated. Then, the vacuum chambers 151 and 152 of the carry-in unit 11 and the heating unit 12 are connected to each other; and the object to be processed is transferred through the vacuum ambience into the vacuum chamber 152 of the heating unit 12.

In the vacuum chamber 152 of the heating unit 12, a plurality of heating lamps 15 are arranged on the ceiling side and the bottom side, and a holder 18 for holding an object to be processed is provided between the heating lamps 15 on the ceiling side and the bottom side. The object to be processed is held by the holder 18.

Reference numeral 7 of FIG. 1 refers to an object to be processed; and the heating lamps 15 are arranged in parallel to the surface side and the back surface side of the object to be processed 7.

Figure 3:
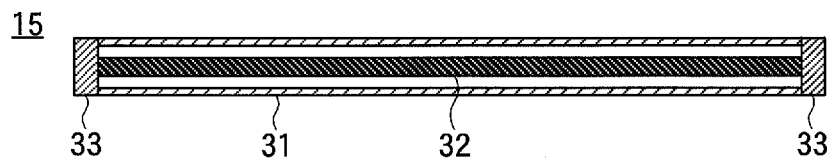
FIG. 3 shows a heating lamp.

The configuration of the heating lamp 15 is shown in FIG. 3. The heating lamp 15 has an elongated glass tube 31 and a filament 32 disposed inside the glass tube 31. The elongated glass tube 31 has an individual electrode 33 disposed at both ends thereof, and both ends of the filament 32 are each connected to the individual electrodes 33.

Figure 4:
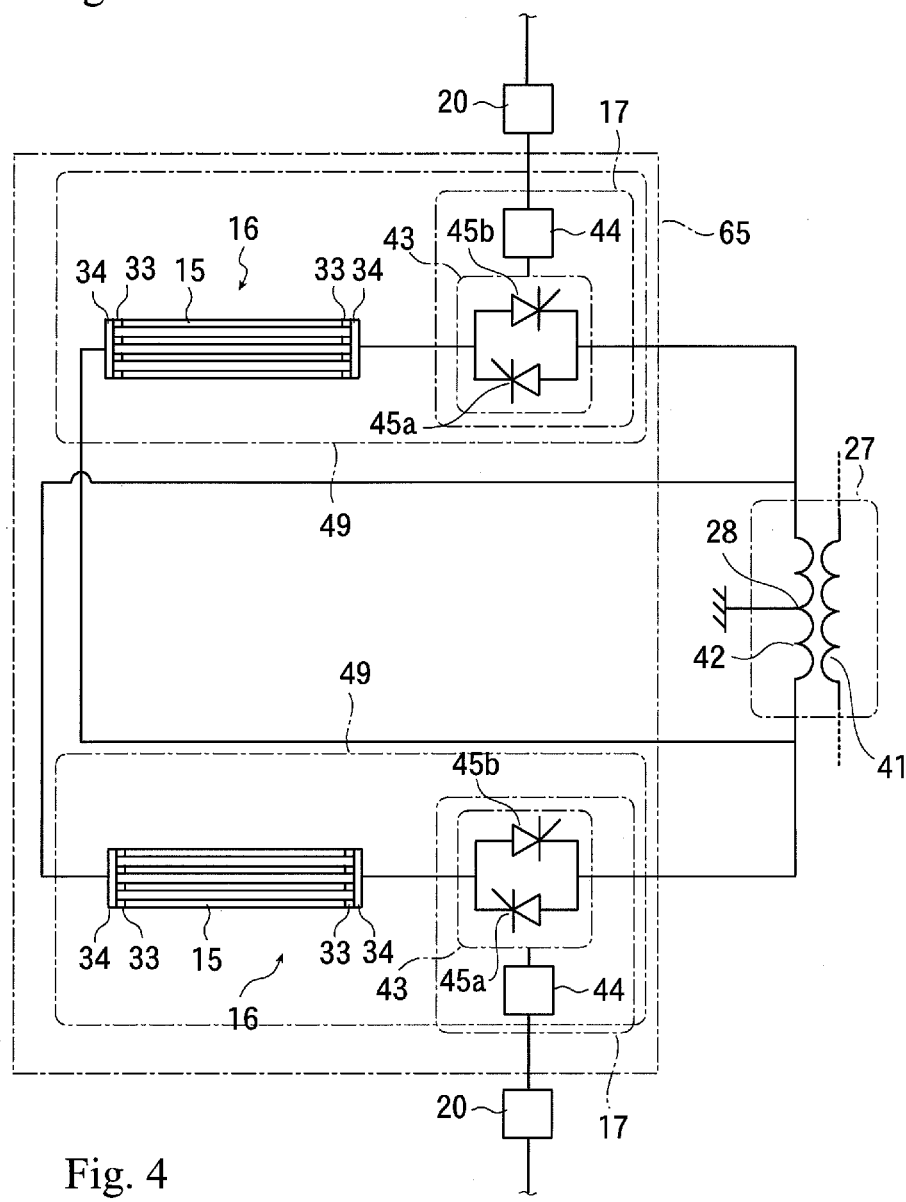
FIG. 4 is a block diagram for applying a voltage to the heating lamp.

As shown in FIG. 4, the two individual electrodes 33 per one of a specified number of (four in this example) heating lamps 15 are each connected to one common electrode 34 and the other common electrode 34. The specified number of heating lamps 15 is connected in parallel to each other to form a module 16.

Figure 2:
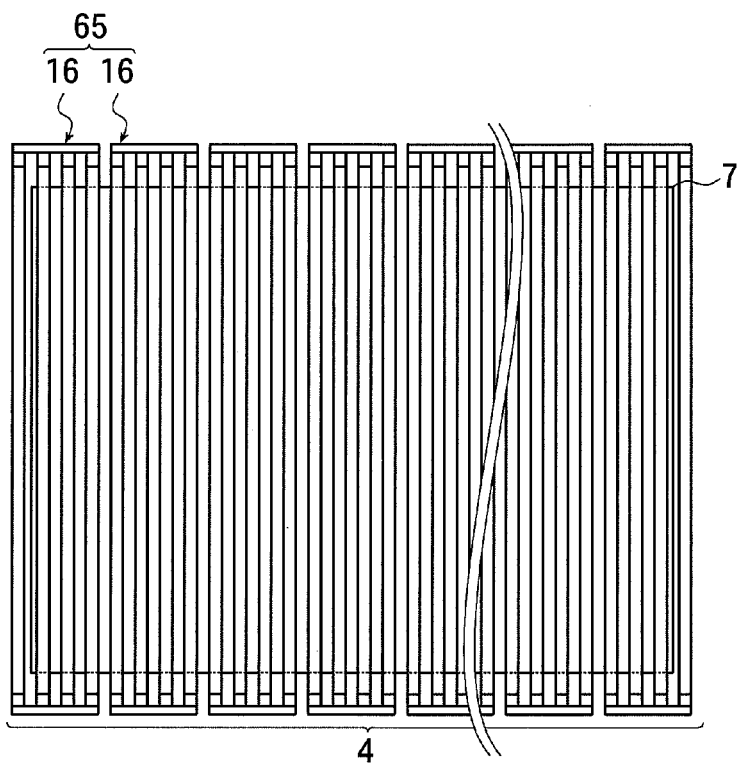
FIG. 2 is an explanatory view for illustrating the positional relationship between a module and an object to be processed.

A plurality of modules 16 are provided in the heating unit 12, a positional relationship between the plurality of heating lamps 15 and the object to be processed 7 being shown in FIG. 2. The plurality of modules 16 are arranged in order to cover both or one of the surfaces of the object to be processed 7 with the heating lamps 15.

Figure 7:
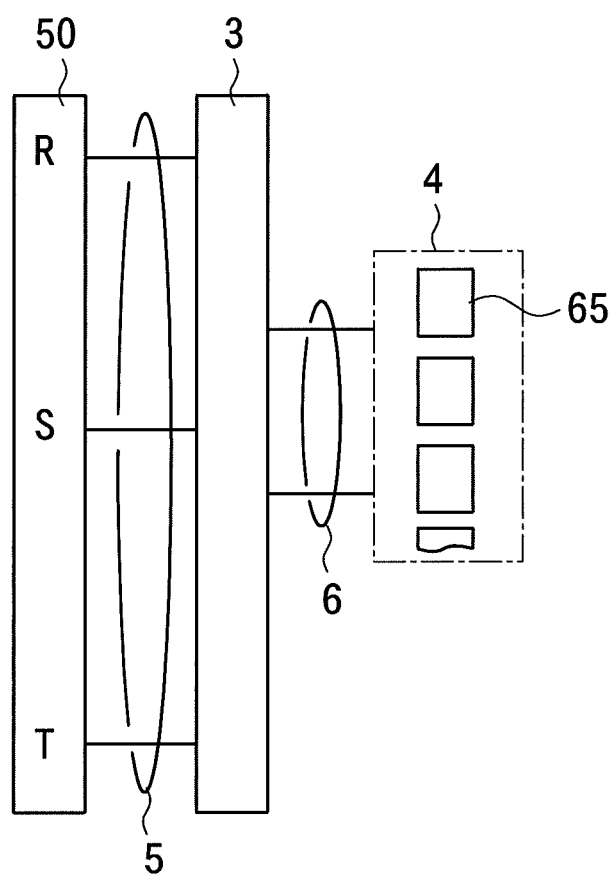
FIG. 7 is a view for illustrating a vacuum heating device of the present invention.

Reference numeral 2 of FIG. 7 denotes a block diagram illustrating an example of a vacuum heating device of the present invention. Reference numeral 4 denotes a heater 4 including heating lamps 15 disposed opposite to both or one of the surfaces of the object to be processed 7.

The vacuum heating device 2 includes a voltage converter 3. The voltage converter 3 converts the three-phase voltage (R phase, S phase, and T phase) supplied from a three-phase AC power source 50 to the primary winding in the voltage converter 3, allowing the secondary winding magnetically coupled to the primary winding to output a secondary voltage to the heater 4 so that power is supplied. The R phase, S phase, and T phase voltages are different in phase by 120° from each other.

Each module 16 includes the same number of heating lamps 15; and two modules 16 are combined into one load 65, which is connected to one secondary winding.

Accordingly, the number of heating lamps 15 constituting the heater 4 is (the number of loads)×2×(the number of heating lamps in one module). Reference numerals 5 and 6 of FIG. 7 schematically illustrate the wirings for connecting the three-phase AC power source 50 to the voltage converter 3, and the wirings for connecting the voltage converter 3 to the heater 4, respectively.

Figure 8A:
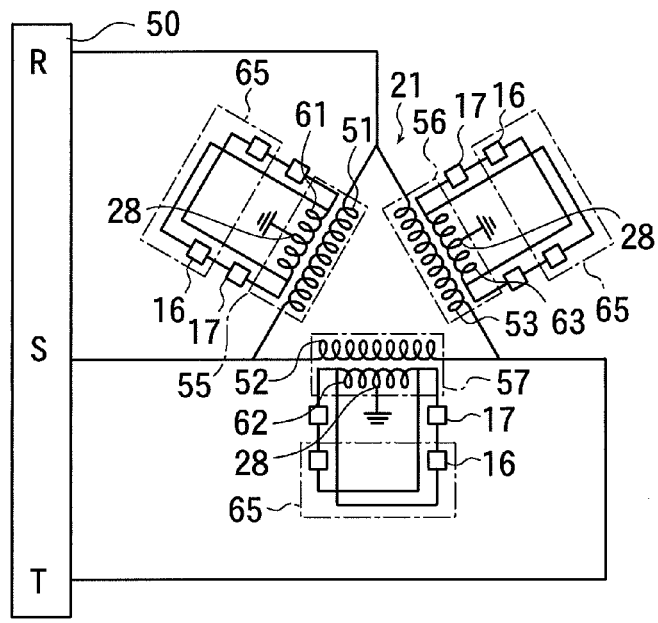
FIG. 8(a) shows a three-phase Δ-connection transformer and FIG. 8(b) shows a three-phase Y-connection transformer.
Figure 8B:
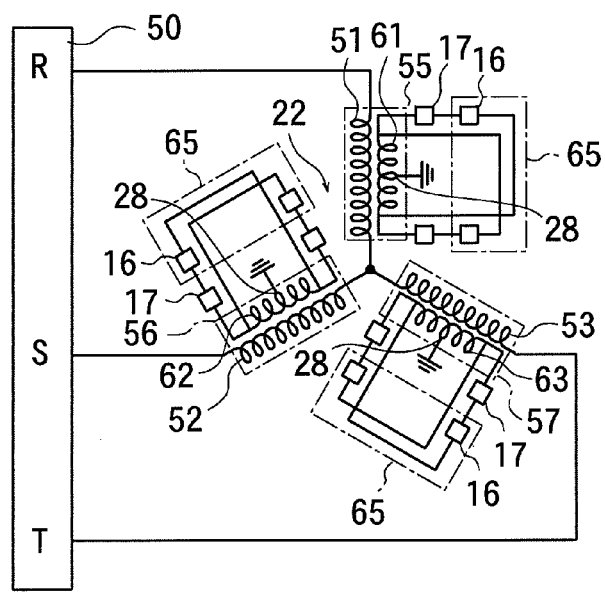
Figure 9:
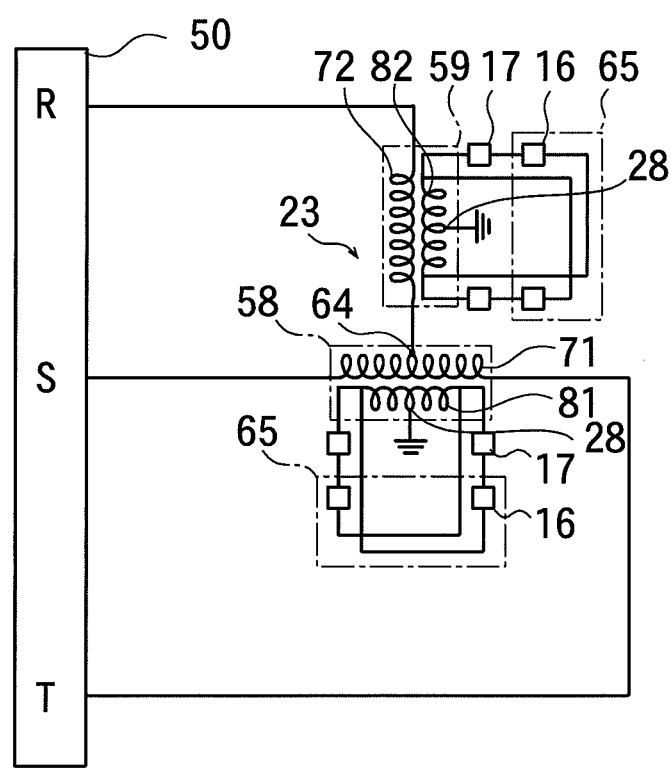
FIG. 9 shows the Scott transformer.

The voltage converter 3 includes at least one three-phase transformers 21 or 22 as shown in FIG. 8(a) or (b) and at least one Scott transformer 23 as shown in FIG. 9.

When the number of loads 65 included in the heater 4 is 3n, use of n three-phase transformers 21 or 22 will eliminate the need of the Scott transformer 23. However, when the number of loads 65 is (3n+2), if n three-phase transformers 21 or 22 and one Scott transformer 23 are used, no secondary winding which is not connected to a load 65 appears. A multiple of two three-phase transformers 21 or 22 out of n three-phase transformers 21 or 22 can be replaced with a multiple of three Scott transformers 23, and one or more Scott transformers 23 can be provided in increments of three.

Figure 10:
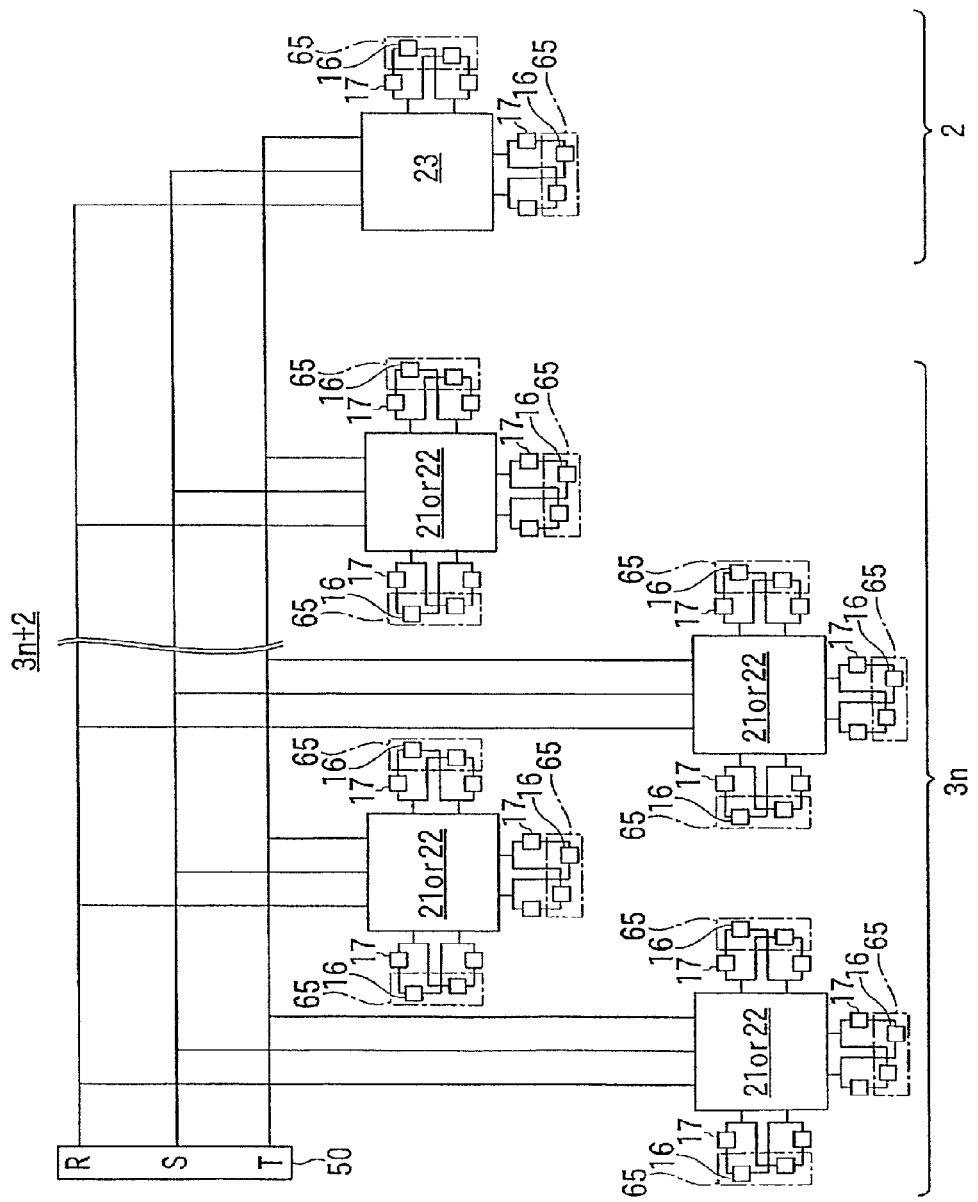
FIG. 10 shows a block circuit of the voltage converting device of the present invention when power is supplied to (3n+2) loads.

FIG. 10 shows a block circuit when a power is supplied to (3n+2) of loads, and three loads are connected per one three-phase transformer (21 or 22) (total number of three-phase transformers 21 or 22 is n), and two loads are connected to one Scott transformer.

Furthermore, when the number of loads 65 is (3n+1), if (n−1) three-phase transformers 21 or 22 and two Scott transformers 23 are used, no secondary winding which is not connected to a load 65 appears.

When the number of loads 65 is (3n+1), a multiple of two three-phase transformers 21 or 22 out of (n−1) three-phase transformers 21 and 22 can be replaced with a multiple of three Scott transformers 23, two or more Scott transformers 23 being provided in increments of three.

Figure 11:
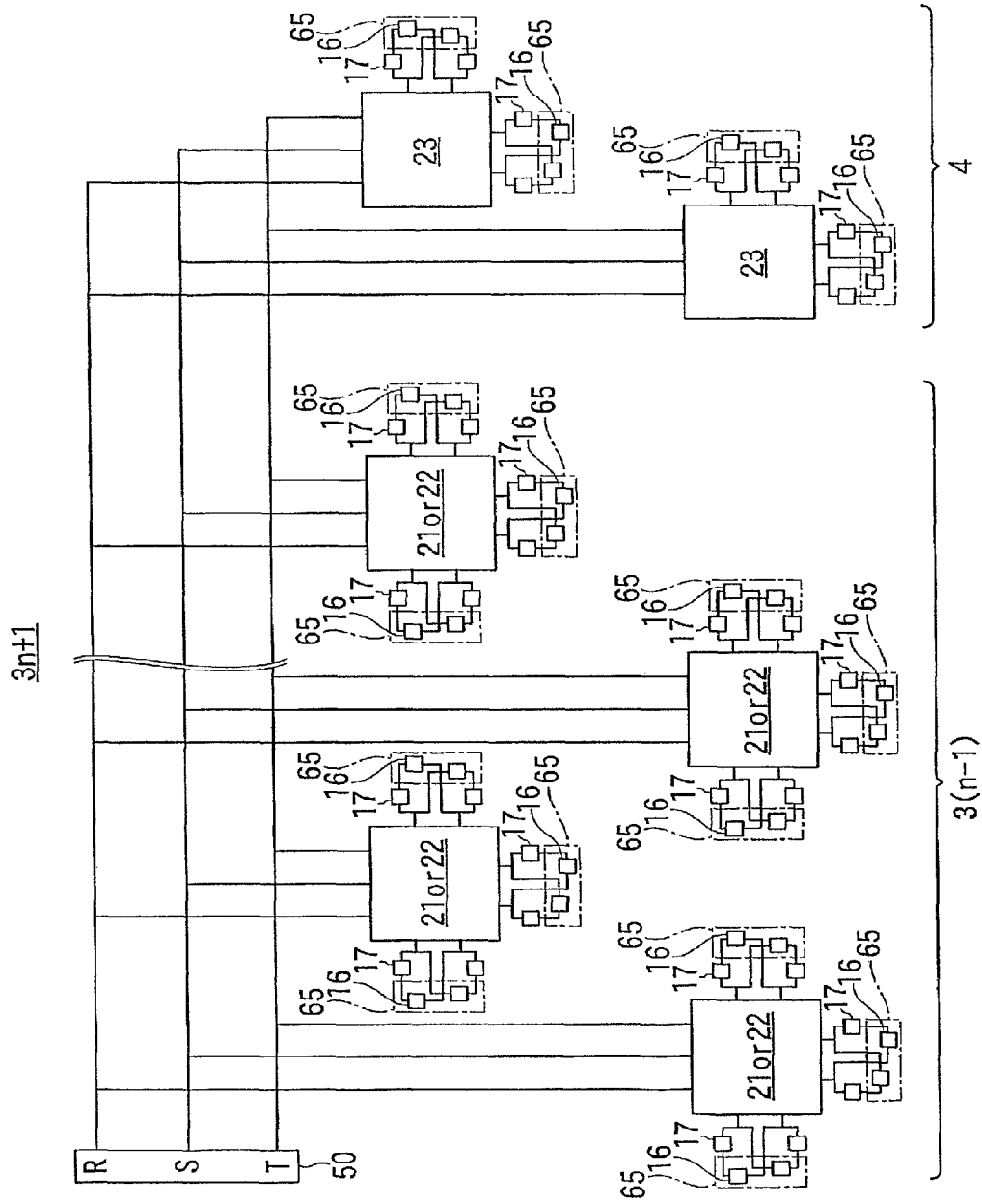
FIG. 11 shows a block circuit of the voltage converting device of the present invention when power is supplied to (3n+1) loads.

FIG. 11 shows a block circuit when a power is supplied to (3n+1) of loads, and three loads are connected per one three-phase transformer (21 or 22) (total number of three-phase transformers 21 or 22 is (n−1)), and four loads (in total) are connected to two Scott transformers.

In the block circuits of FIGS. 10 and 11, the number of Scott transformers is not limited to one or two, and when n loads divided into a multiple of three p and a multiple of two q, p loads are connected to p/3 three-phase transformers and q loads are connected to q/2 Scott transformers, a secondary winding which is not connected to load does not occur.

In conclusion, the number N of loads 65 is divided into a multiple p of three and a multiple q of two (N=p+q), and then a multiple p of three loads 65 are connected to the secondary windings (p in number) of ⅓ of that number (p/3) of three-phase transformers 21 or 22; and then, a multiple q of two loads 65 may be connected to the secondary windings (q in number) of a half of that number (q/2) of Scott transformers 23.

In this case, a plurality of three-phase transformers 21 or 22 for energizing a plurality of loads 65 may include both the three-phase Δ-connection transformers 21 and the three-phase Y-connection transformers 22. Alternatively, only the Δ-connection, only the Y-connection, or a combination of the Δ-connection and the Y-connection may also be available so long as the AC voltage having the same level is induced across the secondary winding. Furthermore, the AC voltage having the same level as the level of the three-phase transformer 21 or 22 may be induced across the secondary windings 81 and 82 of the Scott transformer 23.

Reference numeral 41 of FIG. 4 denotes primary windings 51 to 53 in the three-phase transformer 21 or 22, an M-seat primary winding 71, and a T-seat primary winding 72. Reference numeral 42 denotes secondary windings 61 to 63 of the three-phase transformer 21 or 22 and secondary windings 81 and 82 of the Scott transformer 23, in the case of which the secondary windings are each magnetically coupled to the primary windings.

The load 65 includes two controllers 17.

Each controller 17 has a bidirectional switch 43, and each bidirectional switch 43 is connected in series to the module 16, and forms a series circuit 49.

Two series circuits 49 are connected between both ends of the secondary winding 42.

Here, both ends of the secondary winding 42 are each connected to one common electrode 34 of one module 16 via one of the mutually different controllers 17, while the other common electrode 34 of each module 16 is connected to the other terminal of the secondary winding 42, which is opposed to the terminal in which each module 16 has been connected via the controller 17.

The voltage induced across the secondary winding 42 is applied to the series circuit 49 including the module 16 and the controller 17.

The center tap 28 of the secondary winding 42 (the central portion of the secondary winding 42) is connected to the ground potential.

The voltage at the center tap 28 is half the voltage between both ends of the secondary winding 42 and is at the ground potential. Therefore, when a voltage v is induced between both ends of the secondary winding 42, one end of the secondary winding 42 has a potential of +v/2, while the other end is at a potential of −v/2. Accordingly, the voltage between the chamber wall of the vacuum chamber and the secondary winding 42 is reduced to half the voltage between both ends.

The bidirectional switch 43 provided in the controller 17 can conduct at any phase of an AC voltage. While the bidirectional switch 43 is conducting, the voltage appearing between both ends of the secondary winding 42 is applied to both ends of the heating lamp 15.

The vacuum chamber 152 of the heating unit 12 is connected to the ground potential so that no AC peak voltage having a magnitude of v is occurs between the heating lamp 15 or the controller 17 and the vacuum chamber 152. Since a potential is different within ±(½) at maximum, no discharge occurs between the vacuum chamber 152 and the heating lamp 15, or the like.

An operation of the bidirectional switch 43 will hereinafter be described. The bidirectional switch 43 is made of two thyristors 45a and 45b which are connected in parallel in the opposite directions. The controller 17 is provided therein with a switch controller 44 that is connected to the gate terminal of the two thyristors 45a and 45b which constitute the bidirectional switch 43.

The switch controller 44 allows an electric current to flow into or out of the gate terminal; and the switch controller 44 makes an anode terminal and a cathode terminal of the thyristors 45a and 45b in which the current flow through the gate terminal conduct, and further makes current flow to the anode terminal from the cathode terminal.

The end of the secondary winding 42 connected to the controller 17 is connected to a portion between the anode terminal and the cathode terminal of the bidirectional switch 43. On the other hand, a portion between the anode terminal and the cathode terminal at the opposite side of the bidirectional switch 43 is connected to the common electrode 34 of the heating lamp 15.

When the heating lamps are connected to the secondary winding 42 via the conducting thyristors 45a and 45b, each heating lamp 15 is supplied with a voltage induced between the ends of the secondary winding 42, so that current flows through the filament 32 of the heating lamps 15 in each of the modules 16.

This current heats the filament 32; and heat waves (infrared radiations) are emitted at high temperatures to irradiate the object to be processed 7. This heat wave raises the temperature of the object to be processed 7.

A sensor 19 is provided near the holder 18, and the holder 18 rises in temperature when the heating lamps 15 of each module 16 emit heat waves. The sensor 19 senses this change in temperature.

The temperature of the holder 18 is almost the same as the temperature of the object to be processed 7 held by the holder 18. When the sensor 19 detects the temperature of the holder 18 and the temperature is determined by a temperature measuring device 20, the temperature of the holder 18 detected by the sensor 19 is employed as the temperature of the object to be processed 7. Then, the switch controller 44 controls the bidirectional switch 43 in the manner to be described below.

Figure 5:
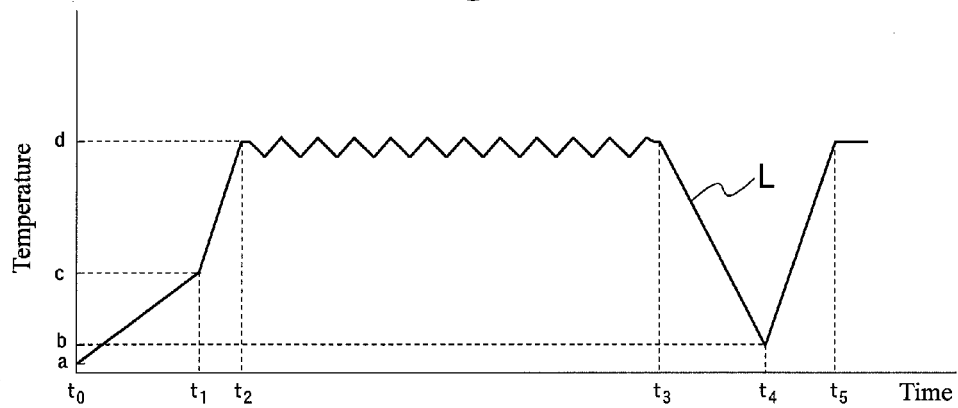
FIG. 5 is a graph showing the temperature of the heating lamp.

The polygonal line denoted with reference numeral L in FIG. 5 represents the relationship between the temperature of the object to be processed 7 (the vertical axis) heated in the heating unit 12 and time (the horizontal axis). First, the object to be processed 7 placed in the heating unit 12 is heated to a processing temperature d, which is almost equal to the temperature maintained in the processing unit 13 and higher than the room temperature (assuming the room temperature is 300 K). Then, in the processing unit 13 downstream of the heating unit 12, vacuum processing (such as, film formation) is carried out while the processing temperature d is maintained.

When the film forming apparatus 1 is out of service and the vacuum chamber 152 and the holder 18 in the heating unit 12 are at room temperature a (FIG. 5), first, before or after the object to be processed 7 is carried into the heating unit 12, the vacuum chamber 152 and the holder 18 in the heating unit 12 are raised in temperature to the processing temperature d.

The controller 17 can energize the heating lamp 15 by cycle control in such a manner that assuming the half wavelength period between the zero V and the zero V of the AC voltage across the secondary winding 42 be 180°, one half wavelength of an AC voltage which is applied to the heating lamp 15 while the conducting thyristor 45a or 45b of the bidirectional switch 43 (or both thyristors) is conducting during entire period of 180°, and the other half wavelength of the AC voltage which is not applied to the heating lamp 15 while the thyristor 45a or 45b (or both thyristors) is interrupted during the entire period of 180° are combined. Alternatively, the conducting thyristor 45a or 45b (or both thyristors) of the bidirectional switch 43 is made conducting from a half way point in a half wavelength or 180° of an AC voltage induced across the secondary winding 42, so that phase control is provided in such a manner as to combine part of the period of a half wavelength. Either control can perform in the present invention.

By the cycle control, a half wavelength of the AC voltage induced across the secondary winding 42 is applied to the heating lamp 15, and the voltage at the center of the half wavelength is certainly applied to the heating lamp 15.

The voltage at the center of the half wavelength is the highest peak voltage of the AC voltage, so that when the heating lamp 15 is at room temperature and the filament 32 has a low resistance, application of a peak voltage will cause an inrush current When the temperature of the heating lamp 15 is raised from room temperature, the bidirectional switch 43 is made conducting (i.e., the conducting thyristor 45a or 45b of the bidirectional switch 43 or both thyristors 45a and 45b are made conducting) at a position past the peak voltage during 180°. Then, at the time of the AC voltage being at zero V, the conduction is (automatically) interrupted. This phase control method can be employed to make current flow through the heating lamp 15 without an inrush current.

In the case of such a phase control method, elongating the period of applying a voltage to the heating lamp 15 makes the heating lamp 15 rise in temperature. Reference numeral v of FIGS. 6(a) and (b) denotes a sinusoidal wave of AC voltage induced across the secondary winding 42, and reference numerals $s_1$ and $s_2$ each denotes the period of a voltage applied to the heating lamp 15 while the phase control is performed. If $s_1 < s_2$, compared to the case where an AC voltage v is applied to the heating lamp 15 for a shorter period $s_1$, the temperature of the heating lamp 15 is raised higher when the AC voltage v is applied for a longer period $s_2$.

However, since the conduction is made when a voltage appears across the secondary winding 42, noise is generated.

It is therefore necessary to change from phase control to cycle control for applying a voltage to the heating lamp 15.

Figure 6:
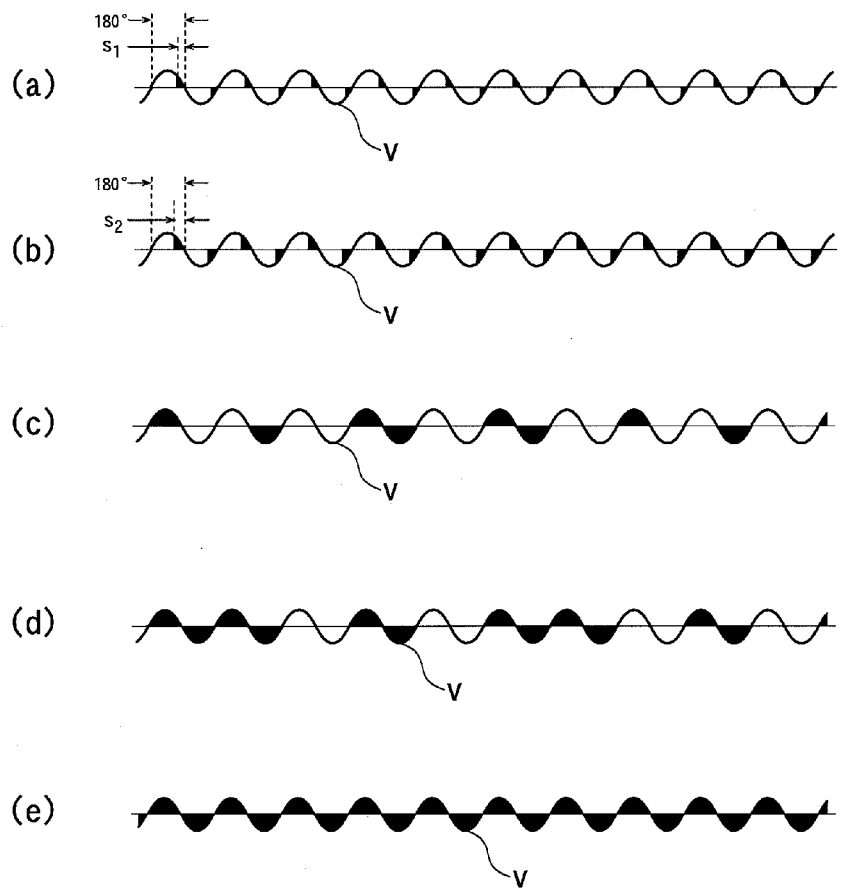
FIGS. 6(a) and (b) show phase control and FIGS. 6(c) to (e) show cycle control.

A temperature, which is lower than the processing temperature d and higher than the room temperature a, is predetermined as a change temperature c at which phase control is changed to cycle control when the heating lamp 15 is being raised in temperature. When the sensor 19 detects that the temperature of the heating lamp 15 is raised by phase control from the room temperature a to the change temperature c, the phase control is terminated. Then, the cycle control is performed to combine the half wavelengths of conduction and interruption so as to increase the ratio of the half wavelength of conduction, thereby raising the temperature of the heating lamp 15. For example, FIG. 6(c) shows a 40% conduction period and FIG. 6(d) shows a 60% conduction period, FIG. 6(d) providing a greater amount of heat wave radiation.

As shown in FIG. 5, the phase control starts at time $t_0$ to raise the temperature of the heating lamp 15 from room temperature a, and at time $t_1$, the cycle control starts at the change temperature c, so that at time $t_2$, the processing temperature d is reached.

When no object to be processed 7 is available inside the heating unit 12, an object to be processed 7 is carried into the heating unit 12 when the sensor 19 detects that the processing temperature d has been achieved.

In this case, since the object 7 to be carried into the heating unit 12 is at room temperature a, the holder 18 and the vacuum chamber 152 located around the object to be processed 7 are lowered in temperature.

Accordingly, since the temperatures of the vacuum chamber 152 and the holder 18 in the heating unit 12 detected by the sensor 19 are lower than the processing temperature d, the ratio of the conduction half wavelength in the cycle control is increased in order to recover to the processing temperature d. When the processing temperature d or higher is reached, the ratio of the conduction half wavelength is reduced.

When no object to be processed 7 is available in the heating unit 12 for a long time, the need for the heating lamp 15 is terminated. From the time $t_3$ at which the energization is stopped, the temperature of the holder 18 and the vacuum chamber 152 decreases, so that the temperature of which the sensor 19 detects becomes low.

A temperature, which is higher than room temperature a and lower than the change temperature c is predetermined as the minimum temperature b. When the temperature detected by the sensor 19 reaches the minimum temperature b due to depressed temperature of the object to be processed 7, the holder 18 and the vacuum chamber 152, the cycle control is re-started at time $t_4$, so that the configuration returns to of the processing temperature d (at time $t_5$) and the heating lamp 15 radiates heat waves. For example, as shown in FIG. 6(e), it is possible to conduct 100%.

For the heating lamp 15 being even at the minimum temperature b, the resistance of the filament 32 of the heating lamp 15 is greater than its resistance at room temperature a, thus causing no inrush current.

Note that the object to be processed 7 raised in temperature to the processing temperature d inside the heating unit 12 is transferred in a vacuum ambience into the processing unit 13. Then, the object to be processed 7 is opposed to the surface of a heater 25 provided in the processing unit 13, and while the processing temperature d is being maintained by the heater 25 generating heat, a target 26 is sputtered in the processing unit 13 so as to form a thin film on a surface of the object to be processed 7.

The object to be processed 7 with the thin film formed thereon is transferred to the carry-out unit 14, which has been evacuated to a vacuum ambience. Then, the communication with the processing unit 13 is closed, and atmospheric air is introduced into the vacuum chamber 154 of the carry-out unit 14, so that the object to be processed 7 is taken out into the atmospheric air.

It is noted that when the controller 17 performs the cycle control, if current consistently flows through the primary and secondary winding 41, 42 during a period for a half wavelength having positive voltage or a period for a half wavelength having negative voltage, a current having only the same direction (positive or negative) flow through the primary and secondary windings 41, 42 so that a magnetic flux having the same direction are induced. There is possibility of coil burnout.

Accordingly, the controller 17 of the present invention is configured to alternately conduct during the half wavelength period having a positive voltage and during the half wavelength period having a negative voltage, so that the positive and negative alternating currents alternately flow through the primary and secondary windings 41 and 42, thereby preventing the coils from burnout.

In the aforementioned embodiment, description was made to film formation by sputtering as vacuum processing. However, the vacuum processing may include not only sputtering but also other film formation methods (such as, CVD or vapor deposition) and a processing method other than film formation (such as, etching, annealing performed in the heating unit 12).

Furthermore, in the aforementioned embodiment, the sensor 19 is installed near the holder 18 and the temperature of the holder 18 is employed as the temperature of the object to be processed 7. However, the temperature of the object to be processed 7 can also be directly measured or the temperature of the vacuum chamber can be measured to employ the temperature of the object to be processed 7.

In the aforementioned example, when the number N of loads 65 is divided into a multiple p of three and a multiple q of two (N=p+q), the three-phase transformers 21 or 22 are used p/3 in number and the Scott transformers 23 are used q/2 in number. However, it is also possible to use a Scott transformer having a secondary winding in which the output voltage is twice or more integer multiple times that of the secondary winding of the three-phase transformer 21 or 22 and to which an integer multiple of series loads are connected. This allows for using one Scott transformer as an integer multiple of Scott transformers. As a result, the number of transformers (such as, the three-phase transformer or the Scott transformer) can be reduced. It is also possible to make the output current from a secondary winding of the Scott transformer twice or more multiple times but not the output voltage, and the secondary winding is connected with an integer multiple of parallel loads. This also makes it possible to use one Scott transformer as an integer multiple of Scott transformers.

In other words, for N loads, three-phase transformers supply power to a multiple p of three of the N loads, while Scott transformers supply power to a multiple q of two loads. If N is a large number, a plurality of combinations of p and q are available for one N. N may be a multiple of three, or other than the case of q=0, a multiple q of three may also be selected.

When the output current through a secondary winding of the Scott transformer is integral multiplied and an integral multiple of loads are connected thereto in parallel, it is possible to provide lower voltages by grounding the midpoint of the secondary winding.

What is claimed is:

1. A vacuum heating device, comprising:
a voltage converter in which a three-phase AC voltage supplied from a three-phase AC power source is input therein, and an AC voltage of which the three-phase AC voltage is converted in magnitude is output as a secondary voltage; and
a plurality of loads, each load provided with a predetermined number of heating lamps which can be energized in parallel, the secondary voltage being applied to the heating lamp and the heating lamp radiates heat waves, wherein
the voltage converter includes:
a plurality of three-phase transformers, including at least one three-phase transformer, including three primary windings, which is connected in a Y-connection shape or a Δ-connection shape to which a three-phase AC voltage is applied, and three secondary windings magnetically coupled to the respective primary windings, one secondary winding supplying power to one of the plurality of loads, respectively; and
a plurality of Scott transformers, including at least one Scott transformer including an M-seat transformer and a T-seat transformer, both ends of an M-seat primary winding of the M-seat transformer being connected to any mutually different phases of the three-phase AC voltage, one end of a T-seat primary winding in the T-seat transformer being connected to a midpoint at which the number of turns of the M-seat primary winding is halved, the other end of the T-seat primary winding being connected to a remaining one phase of the three-phase AC voltage, a number of turns of the secondary winding magnetically coupled to the M-seat primary winding being of the same number of turns of the secondary winding magnetically coupled to the T-seat primary winding, and the T-seat primary winding having a number of turns equal to $(\sqrt{3})/2$ times that of the M-seat primary winding,
wherein the plurality of three-phase transformers and the at least one Scott transformer are used,
wherein a multiple p of three loads and a multiple q of two loads, of which a total number of p and q is a number N of loads, are selected, and the number N of loads are provided for other than a multiple of three,
wherein the multiple p of three loads are supplied with power from the plurality of three-phase transformers,
wherein the multiple q of two loads are supplied with power from the at least one Scott transformer, thereby allowing the heating lamps to generate heat, and
wherein p and q correspond to positive integers.

2. The vacuum heating device according to claim 1, wherein the load has a first module having a plurality of the heating lamps connected in parallel and a second module having the same number of the heating lamps of the first module connected in parallel,
wherein the secondary windings of the three-phase transformer and the Scott transformer have a midpoint at which the number of turns thereof is halved, and the midpoint is connected to ground, the first module and the second module being connected with a bidirectional switch, and
wherein a series circuit of the first module and the bidirectional switch and a series circuit of the second module and the bidirectional switch are each connected between one and the other end of the secondary winding.

3. A vacuum heat treatment method for heating an object to be processed in a vacuum ambience by energizing a number of loads to generate heat, each one of the loads including a predetermined number of heating lamps to be energized in parallel, the number of loads being other than a multiple of three loads,
the method comprising the steps of:
dividing the number of loads into a multiple of three loads and a multiple of two loads, wherein the number of loads is provided for other than a multiple of three;
applying a three-phase AC voltage to three primary windings of a three-phase transformer of which the primary windings are connected as one of a Y-connection shape and a Δ-connection shape;
connecting each one of the loads included in the multiple of three loads in parallel to a respective one secondary winding of secondary windings of the three-phase transformer wherein each one of the secondary windings of the three-phase transformer is magnetically coupled to a respective one of the primary windings of the three-phase transformer, wherein the secondary windings of the three-phase transformer have the same number of turns;
applying AC voltages having different phases of the three-phase AC voltage to both ends of an M-seat primary winding of a Scott transformer;
connecting one end of a T-seat primary winding having a number of turns equal to $(\sqrt{3})/2$ times number of turns of the M-seat primary winding to a midpoint at which the number of turns of the M-seat primary winding is halved and applying an AC voltage of a remaining phase of the three-phase AC voltage to the other end of the T-seat primary winding;
connecting each one of the loads included in the multiple of two loads in parallel to a respective one secondary winding of secondary windings of the Scott transformer, wherein the secondary windings of the Scott transformer have the same number of turns, wherein each of the secondary windings of the Scott transformer is magnetically coupled to a respective one of the M-seat primary winding and the T-seat primary winding of the Scott transformer; and
energizing the heating lamps in the loads so as to generate heat.

4. The vacuum heat treatment method according to claim 3, wherein a change temperature is set to a temperature higher than room temperature and lower than a processing temperature to which a temperature of the object to be processed is raised,
wherein a temperature of the heating lamp is raised by a phase control when the temperature of the heating lamp is lower than the change temperature, and
wherein the phase control is performed in such a manner that the secondary winding and the loads are conducted by a bidirectional switch for a period such that a voltage induced to the secondary winding passed a peak voltage is reduced, and the voltage is interrupted when the induced voltage is at 0 V until the temperature of the heating lamp reaches the change temperature.

5. The vacuum heat treatment method according to claim 4, further comprising the step of raising the temperature of the heating lamp by a cycle control when the heating lamp is at a higher temperature than the change temperature, wherein the cycle control is performed in such a manner that a conduction period for making the bidirectional switch conduct and an interruption period for interrupting the bidirectional switch are combined, and each period is 180°, which is a half wavelength from 0 V to 0 V of a voltage induced across the secondary winding.

6. The vacuum heat treatment method according to claim 5, wherein a ratio of the conduction period and the interruption period of the cycle control is controlled, and the temperature of the heating lamp at a processing temperature is maintained higher than the change temperature.

7. The vacuum heat treatment method according to claim 6, wherein, when the heating lamp stops being energized and the temperature of the heating lamp is lowered from the processing temperature, the cycle control is provided, and the temperature of the heating lamp is raised at a temperature where a minimum temperature higher than room temperature is reached.

8. The vacuum heat treatment method according to claim 4, wherein the Scott transformer corresponds to a plurality of Scott transformers.

9. The vacuum heat treatment method according to claim 3, wherein the three-phase transformer corresponds to a plurality of three-phase transformers.

10. The vacuum heat treatment method according to claim 3, wherein the Scott transformer corresponds to a plurality of Scott transformers.

* * * * *